United States Patent [19]

Siddall

[11] Patent Number: 4,694,477
[45] Date of Patent: Sep. 15, 1987

[54] FLEXURE STAGE ALIGNMENT APPARATUS

[75] Inventor: Graham J. Siddall, Woodside, Calif.

[73] Assignee: Hewlett-Packard Company, Palo Alto, Calif.

[21] Appl. No.: 564,434

[22] Filed: Dec. 21, 1983

[51] Int. Cl.[4] .............................................. G05G 11/00
[52] U.S. Cl. ..................................... 378/34; 250/492.2
[58] Field of Search ...................... 378/34; 250/492.2; 269/55, 58, 71

[56] References Cited

U.S. PATENT DOCUMENTS

| 4,525,852 | 6/1985 | Rosenberg | 378/34 |
| 4,528,451 | 7/1985 | Petric et al. | 250/492.2 |

OTHER PUBLICATIONS

F. E. Scire et al., "Piezodriven 50-μm Range Stage with Subnanometer Resolution," *Rev. Sci. Instrum.*, vol. 49, No. 12, Dec. 1978, pp. 1735-1740.
S. Yamazaki et al., "X-Ray Exposure System Using Finely Position Adjusting Apparatus," *J. Vac. Sci. Technol.*, vol. 15, No. 3, May/Jun. 1978, pp. 987-991.
Pending application Ser. No. 435,177, filed Oct. 19, 1982.

*Primary Examiner*—Janice A. Howell
*Assistant Examiner*—David P. Porta
*Attorney, Agent, or Firm*—Douglas A. Kundrat; Kenneth L. Warsh

[57] ABSTRACT

An apparatus for micropositioning an X-ray lithography mask has but a single stage plate for supporting the mask, three piezoelectric transducers for moving the stage plate in the X-Y plane, and three flexure assemblies located equiangularly around the stage plate for supporting the stage plate and for moving the stage plate in the Z-axis. The flexure assemblies each include a single piezoelectric transducer and various flex strips to allow relative motion of the stage plate to occur smoothly in all six of the possible degrees of freedom.

21 Claims, 6 Drawing Figures

FLEXURE STAGE ALIGNMENT APPARATUS

BACKGROUND AND SUMMARY OF THE INVENTION

In the manufacture of semiconductor devices having submicron line widths, X-ray lithography is often used to replicate a desired pattern from a mask to a semiconductor wafer. Since different masks are used in different processing steps of the wafer, it is of critical importance that the alignment of each mask relative to the wafer be held to a very tight tolerance.

It is known in the prior art to use a combination of a piezoelectric element and a pivoting arm in a positioning device having a single degree of freedom as is shown in an article by Scire and Teague at pages 1735–40 of The Review Of Scientific Instruments, 49(12), December, 1978. In order to provide all six degrees of freedom (translation along, and rotation about, each of the X, Y and Z axes), alignment apparatus constructed according to the prior art have utilized series stacked stages in which each stage provides one or several independent degrees of freedom. Exemplary of such a stacked stage alignment apparatus is a five stage apparatus disclosed by Yamazaki et al at pages 987–991 of The Journal Of Vacuum Science Technology, 15(3), May/June 1978. Since the length of the structural loop between the mask and the wafer increases as the number of stages increases, the prior art stacked stage apparatus becomes more and more susceptible to external vibration as the number of stages increases.

McCoy et al, in U.S. patent application Ser. No. 469,154, now abandoned, disclose a single stage alignment apparatus capable of providing mask movement in only three degrees of freedom (translation along the X and Y axes and rotation about the Z axis). The McCoy, et al apparatus, shown in FIG. 1, uses four piezoelectric elements to support and move the mask.

In accordance with the illustrated preferred embodiment of the present invention, a single stage alignment apparatus provides six degrees of freedom of an X-ray mask relative to a semiconductor wafer. Since only a single stage is used the apparatus is smaller and lighter than a stacked stage apparatus with the result that the stiffness of the apparatus is increased and position control of the mask is improved. The apparatus comprises three flexure assemblies spaced equiangularly around a stage plate which supports the X-ray mask. Each flexure assembly includes a Z-axis piezoelectric transducer and horizontal and vertical flexures which allow the stage plate to move smoothly. Three piezoelectric transducers provide motion of the stage plate in the X-Y plane.

DETAILED DESCRIPTION OF THE PREFERRED EMBODIMENT

Figure 1:
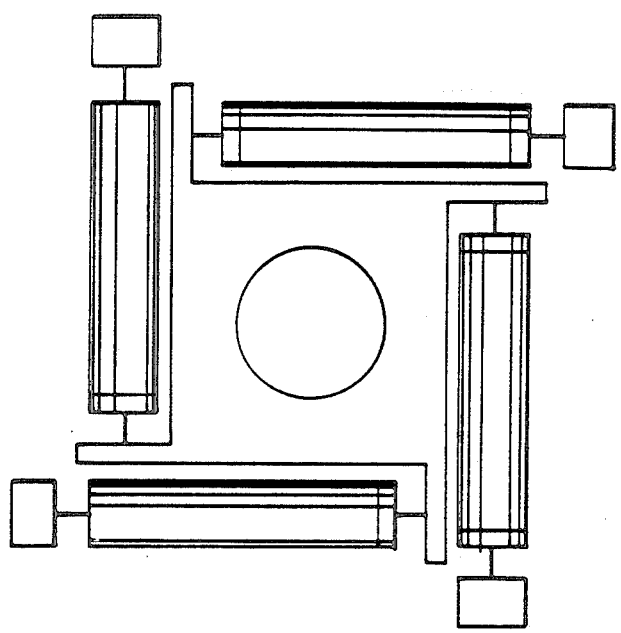
FIG. 1 shows a prior art alignment apparatus which uses four piezoelectric elements to provide three degrees of freedom for movement of a stage plate.

FIG. 1 shows a top view of a prior art alignment apparatus which is disclosed in the McCoy et al U.S. patent application discussed above.

Figure 2:
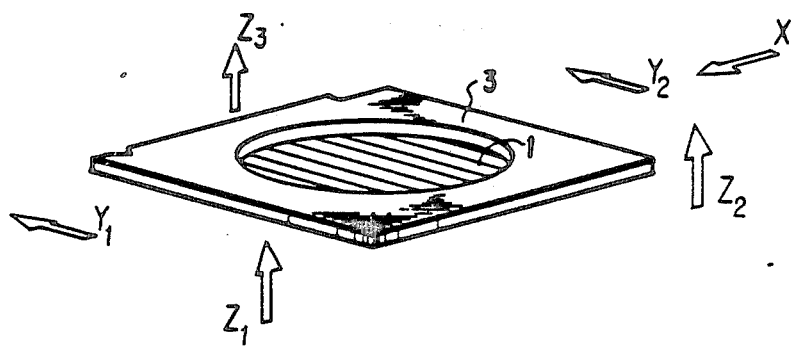
FIG. 2 shows six vectors which may provide six degrees of freedom of a stage plate.

FIG. 2 shows an X-ray mask 1 which is held by a frame 3. Also shown are six displacement vectors which may be combined to provide the six degrees of freedom of mask 1 wherein: X alone provides translation along the X-axis; $Y_1$ and $Y_2$ acting together provide translation along the Y-axis; the difference of $Y_1$ and $Y_2$ provides rotation about the Z-axis; and combinations of the three Z vectors provide translation along the Z-axis and rotation about the X- and Y-axes.

Figure 3:
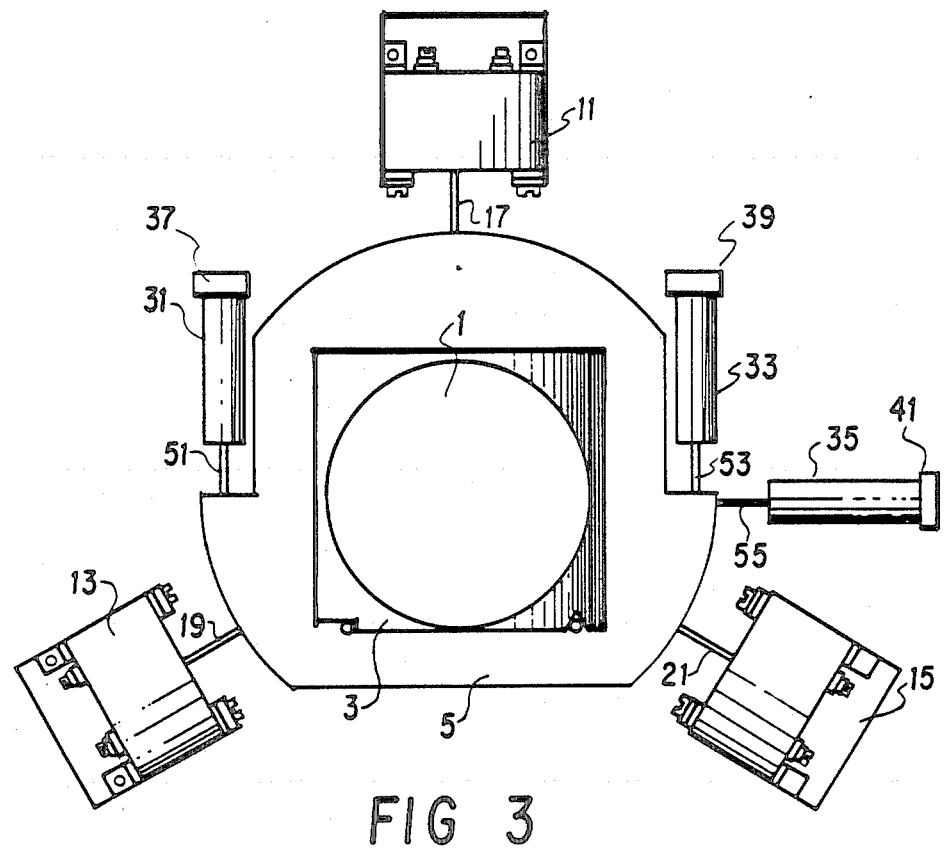
FIG. 3 shows a top view of an alignment apparatus which is constructed in accordance with the preferred embodiment of the present invention.

FIG. 3 shows an alignment apparatus which is constructed in accordance with the preferred embodiment of the present invention. Mask 1 and frame 3 are attached to a single, rigid stage plate 5 which is positionable in the six degrees of freedom. Plate 5 may be positioned in the X-Y plane by the use of well known piezoelectric transducers (PZTs) 31, 33, 35 which are operative for producing displacement in response to an applied electrical potential. For the apparatus shown in FIG. 3, PZTs 31, 33, 35 typically provide a displacement of 40 microns for an applied potential of 1000 volts although the relationship of displacement to voltage is not necessarily linear and hysteresis effects are common. PZTs 31, 33, 35 are connected to stage plate 5 by elastic elements 51, 53, 55, which are stiff along a longitudinal axis and flexible in all directions within a plane normal thereto. Fixed blocks 37, 39, 41 anchor PZTs 31, 33, 35.

Figure 6:
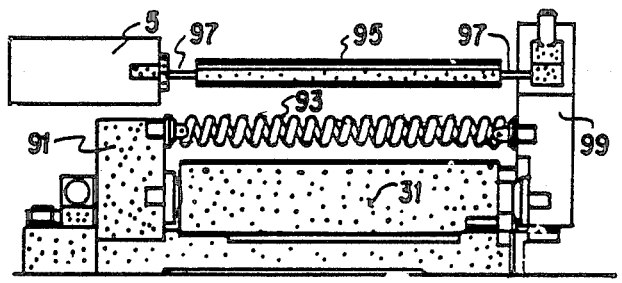
FIG. 6 shows a side view of an actuator assembly which may be used in the apparatus shown in FIG. 3.

FIG. 6 shows a side view of an actuator assembly which may be used to provide PZT displacement amplification. PZT 31 is attached to a fixed pivot assembly 91 and to an arm 99. As PZT 31 is displaced, arm 99 pivots about the attachment point of a stiff spring 93 causing a rigid bar 95 to displace stage plate 5. Elastic elements 97 are stiff in a longitudinal direction and flexible in all directions within a plane normal thereto.

Three flexure assemblies 11, 13, 15 are located equiangularly around stage plate 5, as shown in FIG. 3. Flexure assemblies 11, 13, 15 allow displacement of stage plate 5 in all of the six degrees of freedom with the use of but a single stage plate 5. Flexure assemblies 11, 13, 15 are connected to stage plate 5 by flexure strips 17, 19, 21.

Figure 4:
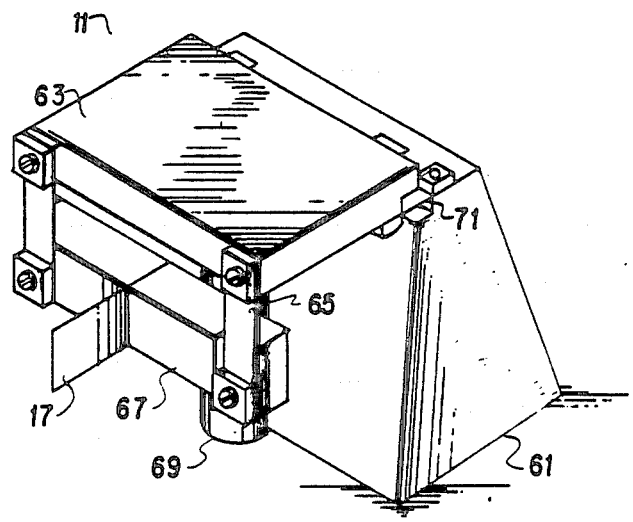
FIG. 4 shows a perspective view of a flexure assembly which is used in the apparatus shown in FIG. 3.
Figure 5:
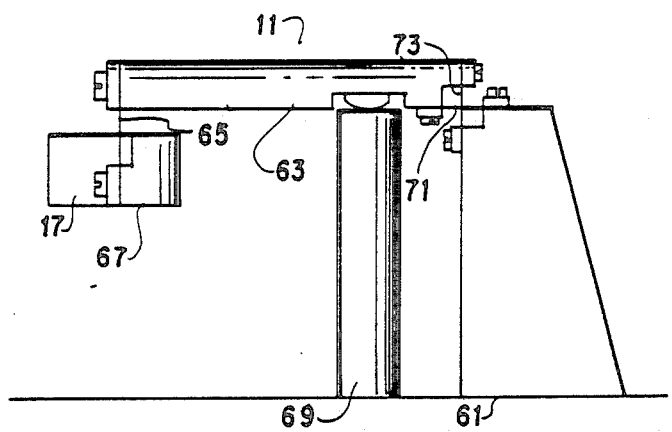
FIG. 5 shows a side view of the flexure assembly shown in FIG. 4.

FIGS. 4 and 5 show more detailed views of flexure assembly 11 which is identical to flexure assemblies 13 and 15. A pedestal 61 is connected by four crossing flexure strips 71 and 73 to an arm 63. Each of flexure strips 71 and 73 may comprise, e.g., hardened beryllium copper having a length of 0.2 inches, a thickness of 0.045 inches and a width of 0.25 inch. The cross points of flexure strips 71 and 73 define an axis about which arm 63 may be smoothly rotated by a vertical PZT 69. Due to the location of vertical PZT 69, a 40 micron vertical displacement (caused by the application of a 1000 volt potential to PZT 69) causes a 160 micron vertical displacement of vertical flexure strips 65 at the end of arm 63.

Rigid bar 67 is attached between vertical flexure strips 65 and a single flexure strip 17 is attached from bar 67 to stage plate 5. Flexure strips 65 and 17, which may be fabricated from a spring material, e.g., hardened beryllium copper, allow relative motion of the stage plate 5 to occur smoothly and repeatably. Thus, movement of mask 1 in any of the six degrees of freedom is achieved without jitter or backlash and with the use of but a single stage plate 5.

The apparatus shown in FIG. 3 may be most efficiently used for aligning an X-ray mask and a semiconductor wafer in a closed loop control system. Alignment devices of the type shown in U.S. patent application Ser. No. 541,385 may be effectively used to provide feedback in the control loop. If it is important to minimize crosstalk between the X- and Y-axes, each of flexure strips 65 should be equal in length and stiffness to flexure strip 17. The point at which flexure strips 65 are attached to bar 67 should be at the vertical midpoint of flexure strip 17, and PZT 35 should be accurately aligned with the center of mask 1.

I claim:

1. A flexure assembly apparatus for supporting a stage plate and X-ray lithography mask comprising:
   a pedestal;
   a horizontal arm;
   attachment means, connecting an end of the horizontal arm to a top of the pedestal, for allowing smooth rotation of the horizontal arm about a rotational axis;
   displacement means, connected to an underside of the horizontal arm, for supporting the horizontal arm and for selectably displacing the horizontal arm in a Z-axis;
   a rigid bar;
   vertical flexure means, connected between the rigid bar and another end of the horizontal arm, for allowing movement of the rigid bar in an X-axis; and
   horizontal flexure means, connected between the rigid bar and the stage plate, for allowing movement of the stage plate in a Y-axis.

2. An apparatus as in claim 1, wherein the attachment means comprises:
   first and second vertical crossing flexure strips connected between the pedestal and the horizontal arm;
   first and second horizontal crossing flexure strips connected between the pedestal and the horizontal arm; and
   wherein a cross point of the horizontal and vertical crossing flexure strips defines the rotational axis.

3. An apparatus as in claim 2, wherein the displacement means comprises a piezoelectric transducer.

4. An apparatus as in claim 3, wherein the vertical and horizontal flexure means each comprise a flexure strip.

5. An apparatus as in claim 4, wherein each flexure strip is fabricated from a spring material.

6. An apparatus as in claim 5, wherein the spring material comprises hardened beryllium copper.

7. An alignment apparatus for movably supporting an X-ray lithography mask, the apparatus comprising:
   a stage plate for holding the mask in an X-Y plane;
   first displacement means, attached to the stage plate and disposed along a radial axis of the stage plate in an X-Y plane, the first displacement means being operative for linearly translating the stage plate along the radial axis;
   second and third displacement means, attached to the stage plate and disposed in the X-Y plane orthogonally to the radial axis, for displacing the stage plate; and
   first, second and third flexure assemblies, attached to the stage plate at first, second and third points distributed equiangularly about the perimeter of the stage plate, the flexure assemblies each being operative for supporting the stage plate and for displacing the stage plate along a Z-axis orthogonal to the X-Y plane.

8. An apparatus as in claim 7, wherein the displacement means each comprise an elastic element attachjed to the stage plate, each elastic element being stiff in a longitudinal axis and flexible orthogonally to the longitudinal axis.

9. An apparatus as in claim 8, wherein the displacement means each comprise a piezoelectric transducer.

10. An apparatus as in claim 9, wherein the first, second and third displacement means are anchored to first, second and third fixed blocks.

11. An apparatus as in claim 10, wherein the second and third displacement means are operative, in combination, for displacing the stage plate rotationally about a center and for displacing the stage plate linearly orthogonal to the radial axis.

12. An alignement apparatus for movably supporting an X-ray lithography mask, the apparatus comprising:
   a stage plate for holding the mask in an X-Y plane;
   first displacement means, attached to the stage plate and disposed along a radial axis of the stage plate in an X-Y plane, the first displacement means being operative for linearly translating the stage plate along the radial axis;
   second and third displacement means, attached to the stage plate and disposed in the X-Y plane orthogonally to the radial axis, for displacing the stage plate;
   first, second and third flexure assemblies, attached to the stage plate at first, second and third points distributed equiangularly about the perimeter of the stage plate, the flexure assemblies each being operative for supporting the stage plate and for displacing the stage plate along a Z-axis orthogonal to the X-Y plane;
   said displacement means each including an elastic element attached to the stage plate, each elastic element being stiff in a longitudinal axis and flexible orthogonally to the longitudinal axis and a piezoelectric transducer;
   said first, second and third displacement means each being anchored to first, second and third fixed blocks;
   said first flexure assembly including;
   a pedestal,
   a horizontal arm,
   attachment means, connecting an end of the horizontal arm to a top of the pedestal, for allowing smooth rotation of the horizontal arm about a rotational axis,
   vertical displacement means, connected to an underside of the horizontal arm, for supporting the horizontal arm and for selectably displacing the horizontal arm in the Z-axis,
   a rigid bar,
   vertical flexure means, connected between the rigid bar and another end of the horizontal arm, for allowing movement of the rigid bar in an X-axis.

13. An apparatus as in claim 12, wherein the attachment means comprises:
   first and second vertical crossing flexure strips connected between the pedestal and the horizontal arm;
   first and second horizontal crossing flexure strips connected between the pedestal and the horizontal arm; and
   wherein a cross point of the horizontal and vertical crossing flexure strips defines the rotational axis.

14. An apparatus as in claim 13, wherein the vertical displacement means comprises a piezoelectric transducer.

15. An apparatus as in claim 14, wherein the vertical and horizontal flexure means each comprise a flexure strip.

16. An apparatus as in claim 15, wherein each flexure strip is fabricated from a spring material.

17. An apparatus as in claim 16, wherein the second and third displacement means are operative, in combination, for displacing the stage plate rotationally about a center and for displacing the stage plate linearly orthogonal to the radial axis.

18. An apparatus as in claim 16, wherein the first, second and third flexure assemblies are disposed along first, second and third radial axes of the stage plate.

19. An apparatus as in claim 16, wherein: the vertical flexure means is substantially equal in length and stiffness to the horizontal flexure means; and
   the vertical flexure means is attached to the rigid bar at a vertical midpoint of the horizontal flexure means.

20. An apparatus as in claim 19, wherein the second and third flexure assemblies are substantially identical to the first flexure assembly.

21. An apparatus as in claim 16, wherein the spring material comprises hardened beryllium copper.

* * * * *